United States Patent [19]
Yoneda et al.

[11] Patent Number: 5,904,506
[45] Date of Patent: May 18, 1999

[54] SEMICONDUCTOR DEVICE SUITABLE FOR TESTING

[75] Inventors: Yoshiyuki Yoneda; Kazuto Tsuji, both of Kawasaki, Japan

[73] Assignee: Fujitsu Limited, Kawasaki, Japan

[21] Appl. No.: 09/058,223

[22] Filed: Apr. 10, 1998

Related U.S. Application Data

[62] Division of application No. 08/498,057, Jul. 5, 1995, Pat. No. 5,767,527.

[30] Foreign Application Priority Data

Jul. 7, 1994 [JP] Japan .................................. 6-155852

[51] Int. Cl.⁶ .......................... H01L 21/44; H01L 21/48; H01L 21/50
[52] U.S. Cl. ......................... 438/124; 438/126; 438/127
[58] Field of Search ..................... 438/124, 126, 438/127, FOR 384, FOR 379, FOR 371

[56] References Cited

U.S. PATENT DOCUMENTS 5,296,744 3/1994 Liang et al. ...................... 257/784

FOREIGN PATENT DOCUMENTS

| 538010 | 4/1993 | European Pat. Off. . |
|---|---|---|
| 57-199228 | 12/1982 | Japan . |
| 1-157451 | 6/1989 | Japan . |
| 1-215050 | 8/1989 | Japan . |
| 2-56942 | 2/1990 | Japan . |
| 3-116767 | 5/1991 | Japan . |
| 3-194956 | 8/1991 | Japan . |
| 5-109930 | 4/1993 | Japan . |
| 6-61363 | 3/1994 | Japan . |
| 7-86458 | 3/1995 | Japan . |

Primary Examiner—John F. Niebling
Assistant Examiner—David A. Zarneke
Attorney, Agent, or Firm—Armstrong, Hattori, Hattori, McLeland & Naughton

[57] ABSTRACT

A semiconductor device includes a rigid member embedded in a resin package body for supporting thereon outer leads that extend from the resin package body and test pads provided on the outer leads for testing the semiconductor device.

4 Claims, 15 Drawing Sheets

FIG. 3A
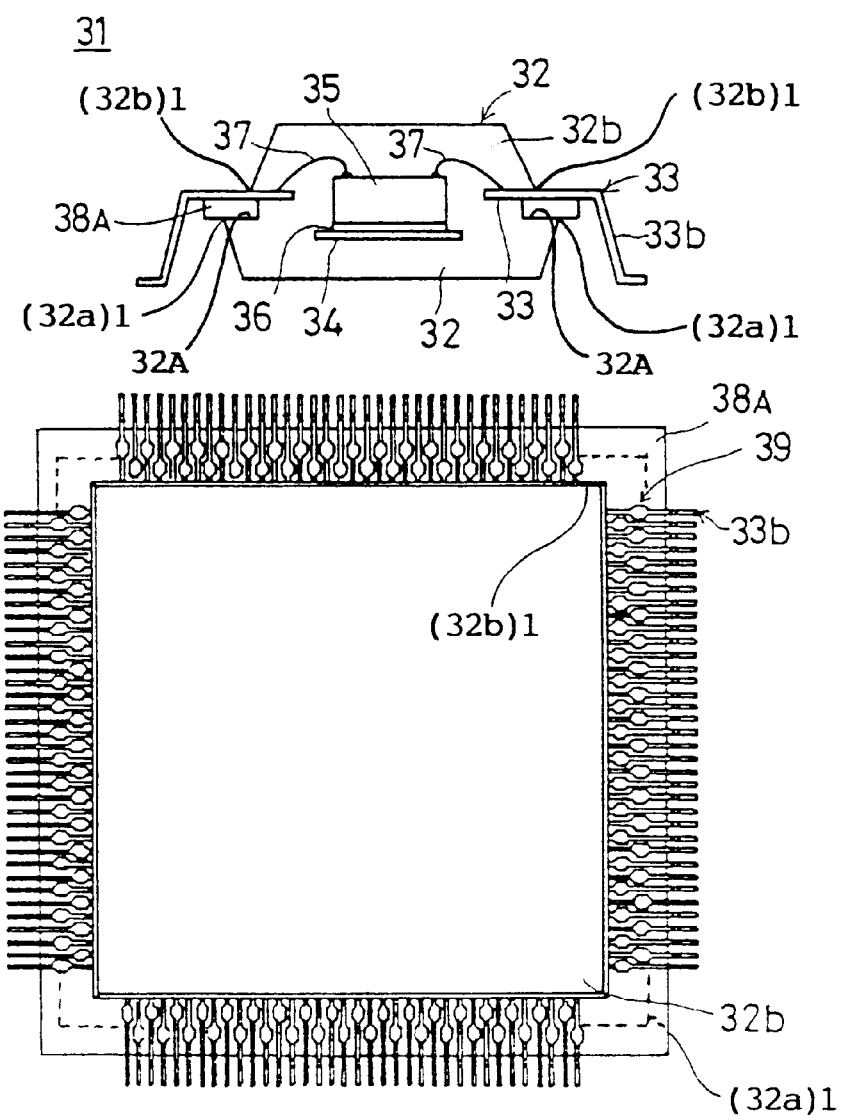
FIG. 3B
FIG. 3C
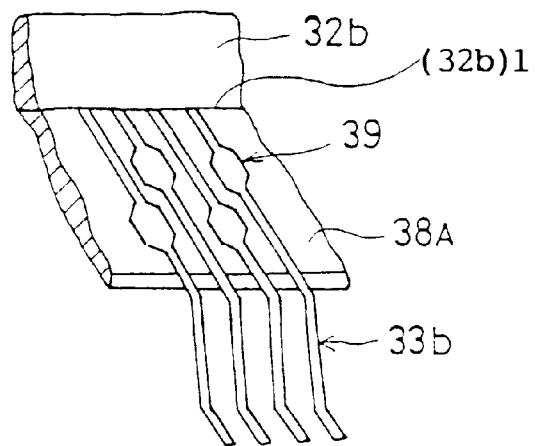

FIG. 13
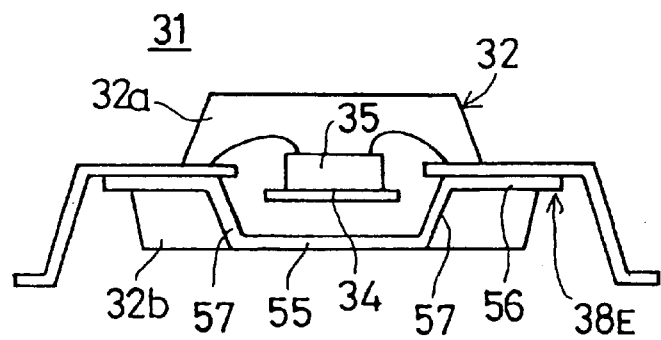
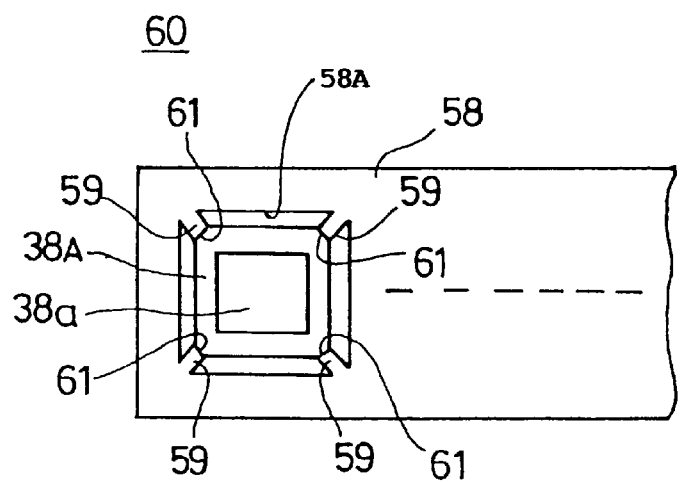
FIG. 14A
FIG. 14B 5,904,506

SEMICONDUCTOR DEVICE SUITABLE FOR TESTING

This application is a divisional of 08/498,057 filed Jul. 5, 1995 now U.S. Pat. No. 5,767,527.

BACKGROUND OF THE INVENTION

The present invention generally relates to semiconductor devices and more particularly to a semiconductor device suitable for testing and a fabrication process thereof.

With increasing integration density of semiconductor integrated circuit, the number of pins extending from the semiconductor integrated circuit is increasing. On the other hand, there is a stringent demand for compact size and reduced cost for such semiconductor integrated circuits. As a result of reduced package size and increased number of pins, the size of individual pins is decreasing particularly in terms of the width and thickness, and there is a tendency that the outer leads projecting outside a package body has a reduced rigidity.

In order to conduct a test of such a device before it is shipped to the customer, it is practiced to form a package body from two package half bodies having respective, different sizes, such that a part of the outer lead projecting from the package body is supported by one of the package half bodies. Thereby, the problem of deformation of the outer lead at the time of testing is avoided even when a probe electrode is contacted upon such a supported outer lead. When forming such a package structure, it is of course necessary to maximize the yield and reduce the fabrication cost.

FIGS. 1A and 1B show a conventional construction of semiconductor device having a package disclosed in the Japanese Laid-open Patent Publication 5-109930, wherein it will be noted that FIG. 1A shows the semiconductor device in an elevational cross sectional view, while FIG. 1B shows the same semiconductor device in a bottom view.

Referring to FIGS. 1A and 1B, the package structure of the disclosed semiconductor device is suitable for testing and includes a semiconductor chip 14 held upon a stage 13 forming a part of a lead frame 12, wherein the semiconductor chip 14 is connected electrically to inner leads 15 forming a part of the lead frame 12 by means of bonding wires 16. The semiconductor chip 14 as well as the stage 13 and the inner leads 15 are embedded in a resin package body 17, and outer leads 18 forming a part of the lead frame 12 project outside the package body 17. In the illustrated example, the outer leads 18 are bent in a downward direction to form a gull-wing structure suitable for mounting upon a printed circuit board.

In the illustrated example, the package body 17 includes an upper half-body 17a located above the level of the inner leads 15 and a lower half-body 17b located below the level of the inner leads 15, wherein the upper half-body 17a has a larger area when viewed from the downward direction with respect to the lower half-body 17b, such that each of the outer leads includes an exposed area when viewed from the downward direction and such that the exposed area is supported by the upper half-body 17a. In correspondence to the exposed area of the outer leads 18, a contact region 18a is formed for contacting with a probe electrode when conducting a test of the device as indicated in the bottom view of FIG. 1B. It is also possible to form the lower package half-body 17b to be larger than the upper package half-body 17a.

FIG. 2 shows the process for molding the resin package body 17 of the device of FIGS. 1A and 1B.

Referring to FIG. 2, the lead frame 12 carrying thereon the semiconductor chip 14 in correspondence to the stage 13 defined thereon, is mounted, after interconnecting the chip 14 and the inner leads 15 by the bonding wires 16, on a lower mold 19b, such that the stage 13 as well as the semiconductor chip 14 and the bonding wires 16 are accommodated in a mold cavity 20 which is formed between the lower mold 19b and an upper mold 19a. Thereby, the upper mold 19a is formed with a depression that forms the upper half of the mold cavity such that the depression of the upper mold 19a is substantially larger, in terms of the area when viewed from the upward direction in FIG. 2, as compared with a corresponding depression formed on the lower mold 19b. It should be noted that the lower mold 19b carries a projection 21 for engagement with a corresponding depression formed on the upper mold 19a for achieving a proper alignment between the upper mold 19a and the lower mold 19b. By injecting a resin into the cavity 20 from a gate 22 formed on the upper mold 19a, the molding of the resin package body 17 is achieved.

In the molding process of FIG. 2, it should be noted that, because of the different sizes of the depressions provided on the upper and lower molds 19a and 19b, there may occur a case in which the lower part of the cavity 20 is filled completely by the resin before the upper part is filled by the resin. When this occurs, the inner leads 15 may be displaced in the upward direction as a result of the flow of the resin for equilibrating the pressure inside the cavity 20. As a result, the contact region 18a shown in FIG. 1B may be covered by a burr projecting laterally from the resin package body 17. Such a burr is difficult to remove even by a honing process and decreases the yield of the device.

SUMMARY OF THE INVENTION

Accordingly, it is an object of the present invention to provide a semiconductor device suitable for testing, wherein the foregoing problems are eliminated.

Another and more specific object of the present invention is to provide a semiconductor device having an outer lead adapted for contact with an external probe electrode for testing, wherein the semiconductor device has a structure suitable for production with high yield.

Another object of the present invention is to provide a method for fabricating a semiconductor device having a lead adapted for testing by contacting with an external probe electrode, with increased yield.

Another object of the present invention is to provide a mold for molding a resin package body of a semiconductor device that includes an outer lead adapted for contacting with an external probe electrode for testing, such that the semiconductor device is produced with a high yield, without causing the problem of the outer lead being covered by a resin burr extending laterally from the resin package body.

Another object of the present invention is to provide a semiconductor device, comprising:

a lead frame including an inner lead and an outer lead;

a semiconductor chip mounted upon said lead frame and wired with said inner lead;

a resin package body accommodating therein said semiconductor chip and said inner lead;

said resin package body having a package surface on which said outer lead extends in such a manner that said outer lead is supported upon said package surface; and a rigid member provided upon said package surface so as to support said outer lead thereon, said rigid member thereby preventing a deformation in said outer lead supported thereon.

Preferably, the foregoing package surface is formed so as to extend between an outer periphery defining an upper half part of the resin package body and an outer periphery defining a lower half part of the resin package body.

Another object of the present invention is to provide a mold for molding a resin package body of a semiconductor device, comprising:

a first mold having a first rim surface surrounding and thereby defining a first depression;

a second mold having a second rim surface surrounding and thereby defining a second depression;

said first and second depressions being formed to define together a mold cavity when said first mold and said second mold are assembled with each other such that said first and second rim surfaces mate with each other, said first depression having a size larger than said second depression;

said first rim surface being adapted for supporting a lead frame that includes a stage for supporting a semiconductor chip, a plurality of inner leads, and a plurality of outer leads, in such a manner that said outer leads are supported on said first rim and that said stage and said inner leads are accommodated in said first depression;

said first rim being further provided with a groove extending along an inner periphery of said first rim, said groove being defined by a circumferential wall extending along said inner periphery of said first rim and a bottom surface continuing from said circumferential wall and extending toward said first depression, said groove being adapted for accommodating a rigid member such that said rigid member is supported upon said bottom surface.

Another object of the present invention is to provide a method for fabricating a semiconductor device, comprising the steps of:

setting a rigid member upon a first mold, said first mold having a first rim surface surrounding and thereby defining a first depression;

setting a lead frame carrying thereon a semiconductor chip, such that an outer lead of said lead frame is supported upon said first rim surface and such that an inner lead of said lead frame as well as said semiconductor chip held upon a stage of said lead frame are located in said first depression, said step of setting the lead frame is conducted such that a pad region formed on said outer lead for contacting with a probe electrode is located on said rigid member;

placing a second mold having a second rim surface surrounding and thereby defining a second, smaller depression, upon said first mold, such that said second rim surface mates with said first rim surface and such that said first and second depressions form together a mold cavity in which said inner lead and said semiconductor chip are accommodated together with said stage that carries thereon said semiconductor chip; and injecting a resin into said mold cavity to mold a resin package body such that said resin package body encapsulates therein said inner lead and said semiconductor chip together with said stage.

According to the present invention as set forth above, the deformation of the outer lead at the time of molding of the resin package body is successfully prevented by the rigid member provided on the foregoing package surface, even when the upper and lower parts of the resin package body have different sizes and thus there occurs a flow of resin at the time of molding of such a package body for equilibrating the pressure inside a mold cavity. Such a rigid member may be provided so as to seat upon a groove provided along an inner cavity wall of a lower mold or to seat upon the inner cavity wall itself.

While the rigid member of the present invention, which supports the outer leads thereon, is required to be insulative, it is also desirable that the rigid member is formed of a thermally conductive material. Thus, one may provide the rigid member from a metal coated by an insulating layer that may include a hard insulating layer such as ceramics and a soft insulating layer such as resin. In order to improve heat dissipation, one may form the rigid member from a rim part for supporting the outer leads thereon and a recessed central part continuing from the inner periphery of the rim part, such that the central part is exposed to the package surface. Thereby, such a central part acts as an effective heat sink.

In order to improve the adherence of the rigid member to the package body, one may provide depressions or penetrating holes upon the rigid member for increasing the area of contact with the resin package body. Further, the rigid member may have one or more central apertures for facilitating flowing of the resin at the time of molding the resin package body. In an embodiment, the rigid member has rectangular shape formed with a large, single, rectangular central aperture. Alternatively, the rigid member may be a rectangular member formed with a number of apertures for allowing passage of the resin.

It should be noted that such a rigid member may be formed in a frame member such that the rigid member is connected to the frame member by a bridging part. By using such a frame member, the process for setting the rigid member upon the mold is substantially facilitated. It should be noted that the bridging part is simply cut after the molding of the resin package body has been completed.

By providing the test pad region for testing on the outer leads in correspondence to the part supported by the rigid member, it is also possible to avoid deformation of the outer leads and hence a damage to the package body at the time when an external probe electrode is contacted to such a test pad at the time of testing. Further, by providing the test pads on the outer leads in a staggered relationship, it is possible to reduce the distance between adjacent test pads and hence the size of the semiconductor device. Further, it is possible prevent the leakage of the resin at the time of molding, by providing regions of increased width in some or all of the outer leads such that such a region is located close to the resin package body as compared with the test pad. Thereby, the problem of the test pad being covered by a resin film is avoided.

Other objects and further features of the present invention will become apparent from the following detailed description when read in conjunction with the attached drawings.

BRIEF DESCRIPTION OF THE DRAWINGS

FIGS. 3A–3C are diagrams showing a semiconductor device according to a first embodiment of the present invention in which a rigid member is used for supporting outer leads;

FIG. 13 is a diagram showing a semiconductor device that uses a rigid member that provides an improved heat dissipation;

FIGS. 14A and 14B are diagrams showing the construction of the rigid member suitable for mass production of the semiconductor device as well as a process for fabricating a semiconductor device that uses such a rigid member;

DETAILED DESCRIPTION OF THE PREFERRED EMBODIMENTS

Figure 1A:
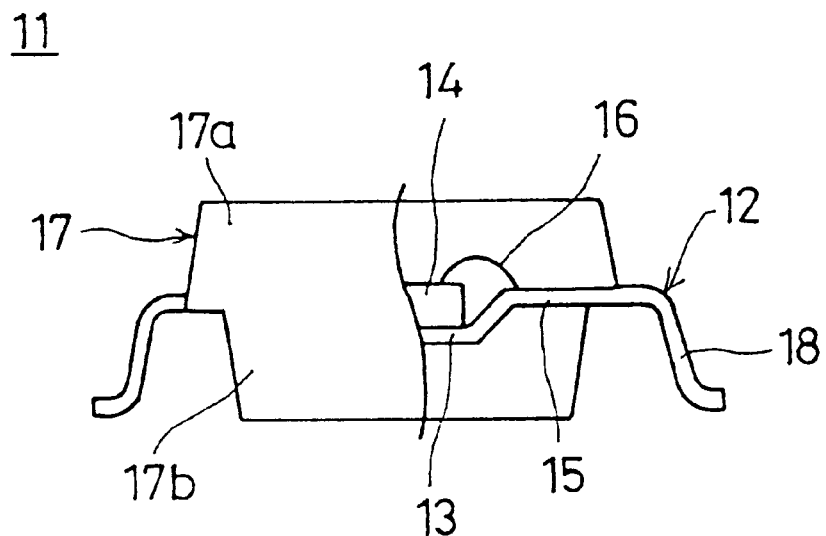
FIGS. 1A and 1B are diagrams showing the construction of a conventional semiconductor device.
Figure 1B:
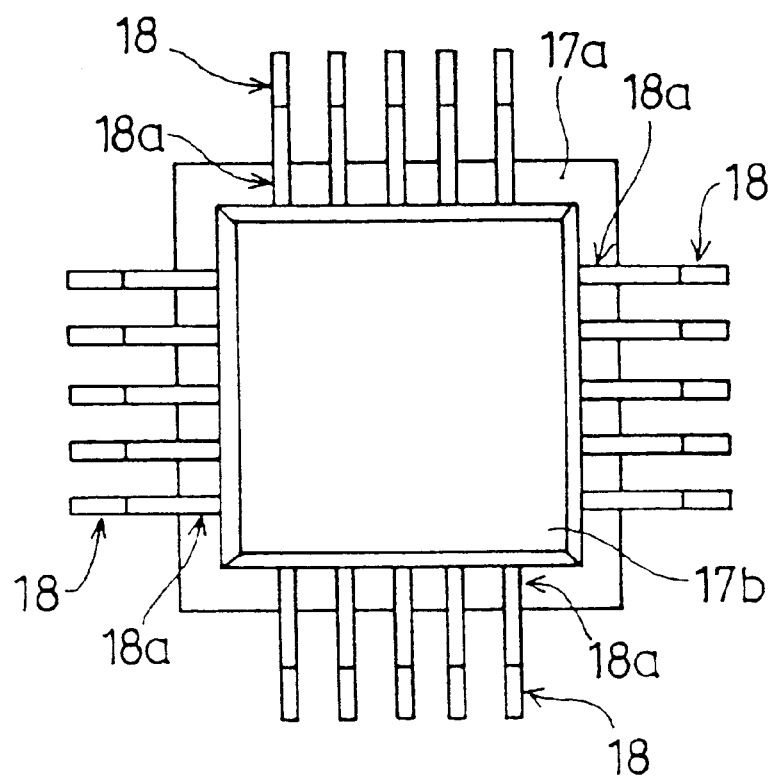
Figure 2:
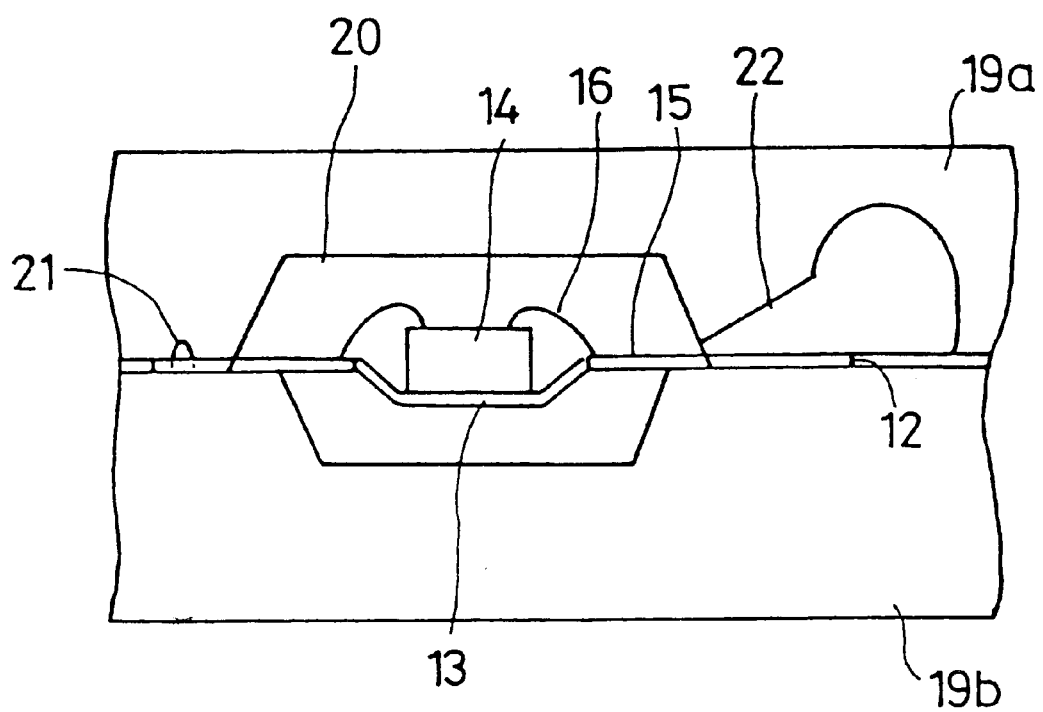
FIG. 2 is a diagram showing the process for fabricating the semiconductor device of FIGS. 1A and 1B.

FIGS. 3A–3C show a semiconductor device 31 according to a first embodiment of the present invention, wherein FIG. 3A shows the device 31 in an elevational cross sectional view while FIG. 3B shows the same device 31 in a plan view. Further, FIG. 3C shows a part of the semiconductor device 31 in an enlarged perspective view.

Referring to FIGS. 3A–3C, it will be noted that the semiconductor device 31 is designed for surface mounting and includes a resin package body 32 that, in fact, is formed of a larger lower half-body 32a and a smaller upper half-body 32b, wherein there is formed a discrepancy between a larger outer periphery of the lower half-body 32a and a smaller outer periphery of the upper half-body 32b.

The lower and upper half-bodies 32a and 32b thereby form the resin package body 32 as a unitary, integral body, wherein the package body 32 accommodates therein a semiconductor chip 35 in the state that the chip 35 is mounted upon a lead frame stage 34 defined on a lead frame 33 by means of a bonding layer 36 of braze alloy or adhesive. As usual, the semiconductor chip 35 is wired to inner leads 33a that form a part of the lead frame 33 by means of bonding wires 37, wherein the inner leads 33a and the bonding wires 37 are encapsulated in the resin package body 32, and the inner leads 33a protrude laterally from the package body 32 to form outer leads 33b. The outer leads 33b are bent in the downward direction as indicated in FIG. 3A to form a gull wing structure suitable for surface mounting upon a printed circuit board.

In the semiconductor device 31 of the present embodiment, it should be noted that there is formed a package surface 32A extending between an outer periphery $(32a)_1$ of the lower half-body 32a and an outer periphery $(32b)_1$ of the upper half-body 32b, wherein there is provided a rigid member 38A on the package surface 32A such that the rigid member 38A surrounds the package body 32 laterally as indicated in the plan view of FIG. 3B.

As will be noted in FIGS. 3A and 3B as well as in the enlarged view of FIG. 3C, the rigid member 38A supports thereon the outer leads 33b projecting from the resin package body 32, wherein each of the outer leads 33b includes a pad region 39 having an increased width, in correspondence to the part located upon the rigid member 38, as a test pad. Thus, by using such a test pad for contacting with an external probe electrode (not shown) at the time of testing the device, it is possible to avoid the deformation of the outer leads 33b and any damage to the package body as a result of the deformation. By providing the pad region 39 to the outer leads 33b in a staggered relationship as indicated in FIG. 3C, it is possible to reduce the distance between adjacent outer leads 33b, and hence the size of the semiconductor device. It should be noted that use of such a rigid member supporting the outer leads 33b in correspondence to the part extending over the package surface 32A, is particularly useful in the molding process of the resin package body 32 as will be described later.

Figure 4A:
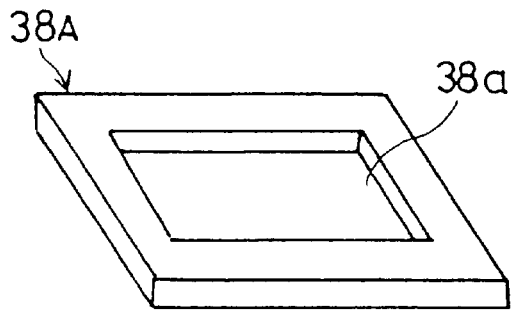
FIGS. 4A and 4B are diagrams respectively showing examples of the rigid member used in the semiconductor device of the present invention in a perspective view.
Figure 4B:
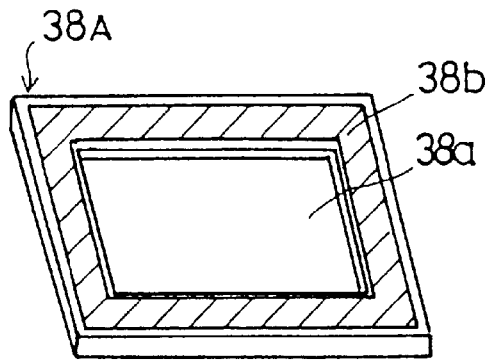

FIGS. 4A and 4B show the examples of the rigid member 38A, wherein it will be noted that any of the rigid members 38A has a rectangular shape formed with a large central opening 38a for accommodating the semiconductor chip 35 in the resin package body 32. See the cross sectional view of FIG. 3A. In the illustrated example of FIG. 4A, the rigid member 38A is formed of an insulating material such as cured prepreg, aluminum nitride, alumina, and the like. By using insulating material for the rigid member 38A, it is possible to provide the outer leads 33b directly in contact with the rigid member 38A.

In the example of FIG. 4B, on the other hand, the rigid member 38A is formed of a metal such as copper, copper alloy, aluminum, aluminum alloy, and the like, and an adhesive layer or tape 38b is formed on the metal rigid member 38a. In such a construction, the short circuit of the outer leads 33b is avoided by the adhesive layer 38b acting as an insulating layer, while simultaneously achieving efficient heat transfer taking place through the rigid member 38A. The adhesive layer or tape 38b thereby holds the outer leads 33b effectively. Further, one may form an oxide coating on the surface of the rigid member 38A when the member 38A is formed of aluminum. In the case the member 38A is formed of copper or copper alloy, it is possible to form an anodic oxide film on the surface of the rigid member 38A.

It should be noted that the rigid member 38A may be formed by stamping or etching a metal sheet when the member 38A is formed of a metal. When the member 38A is formed of a ceramic, on the other hand, the rigid member 38A is formed by shaping a green body of the ceramic to form the opening 38a, followed by sintering.

Figure 5A:
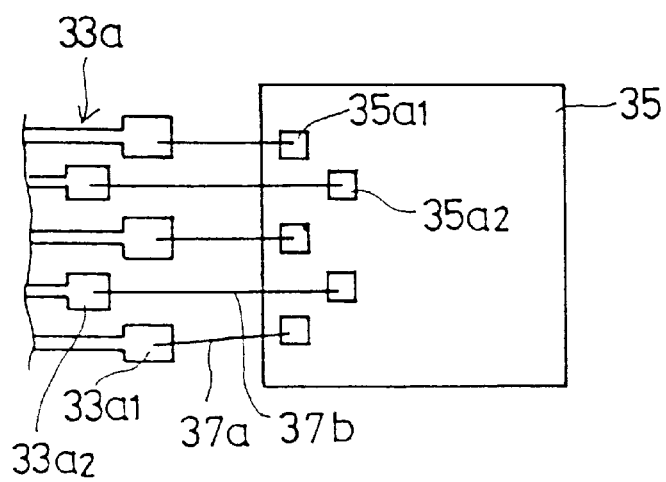
FIGS. 5A and 5B are diagrams showing the wiring between a semiconductor chip and inner leads; in the semiconductor device of the present invention.
Figure 5B:
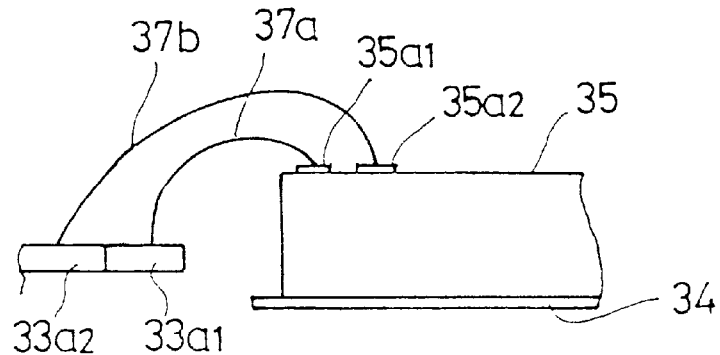

FIGS. 5A and 5B show the wiring between the semiconductor chip 35 and the inner leads 33a.

Referring to FIG. 5A, the semiconductor chip 35 carries thereon electrode pads $35a_1$ and $35a_2$ along an outer periphery of the chip in two rows, and each of the inner leads 33a is provided with a bonding pad $33a_1$ or $33a_2$ at an inner end thereof. Thereby, the bonding pad $33a_1$ is formed closer to the chip 35 as compared with the bonding pad $33a_2$, such that the pad $33a_1$ is formed adjacent to an electrode pad $35a_2$ that is located at the outer side of the electrode rows. Further, the bonding pad $33a_2$ is connected to a corresponding electrode pad $35a_2$ located at the inner side of the electrode rows.

FIG. 5B shows the wiring or interconnection between the electrode pad $35a_1$ or $35a_2$ and the inner lead 33a. As will be noted the outer electrode pad $35a_1$ is connected to a corresponding inner bonding pad $33a_1$ located closer to the semiconductor chip 35 by means of a bonding wire 37a, while the inner electrode pad $35a_2$ is connected to a corresponding outer bonding pad $33a_2$ by means of a bonding wire 37b. Thereby, the bonding wire 37a reaches a maximum height or loop height lower than the corresponding maximum height of the bonding wire 37a, and the short circuit between the bonding wires 37a and 37b are positively avoided.

In the construction of FIGS. 5A and 5B, it should further be noted that, by forming the bonding pads $33a_1$ and $33a_2$ at the inner end of the lead wires 33a in a staggered relationship as indicated in FIG. 5A, one can reduce the pitch of the inner leads 33a without causing a short circuit between adjacent lead wires.

Of course, one may provide the electrode pads on the semiconductor chip 35 in a single row in the semiconductor device 31 of the present embodiment. Further, one may form the bonding pads at the inner end of the inner leads 33a such that the bonding pads are aligned in a single row.

Figure 6A:
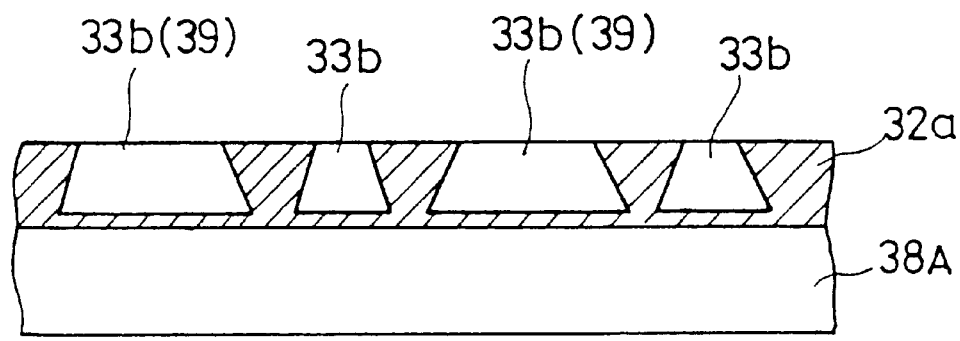
FIGS. 6A and 6B are diagrams showing various cross sections of the outer leads used in the semiconductor device of the present invention.
Figure 6B:
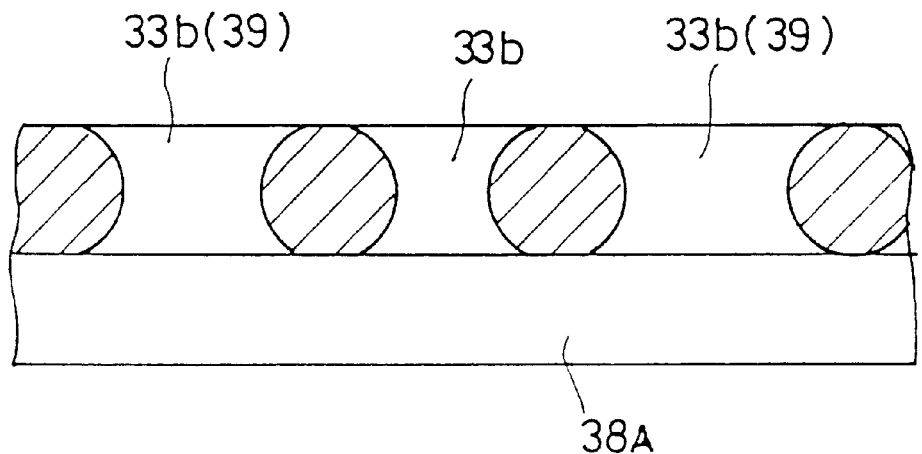

FIGS. 6A and 6B show different examples of the lead frame 33.

Referring to FIG. 6A, showing the cross section of the outer leads 33b including the test pad 39, it should be noted that each of the outer leads 33b has a trapezoidal cross section having an increased base area and inclined side wall, and is embedded in a resin layer forming a part of the lower package half-body 32a, on the rigid member 38A that supports the outer leads 33b. By providing the tapered, trapezoidal structure defined by the inclined side wall for the outer lead 33b as well as for the test pad 39, the resin that forms the package body 32 penetrates into the gap between adjacent outer leads 33b at the time of molding of the package body 32, and the outer leads 33b are held positively and firmly by the resin thus filling the gap upon curing of the resin.

In the example of FIG. 6B, on the other hand, the outer leads 33b are formed to have increased area for the top and bottom surfaces as compared with the intermediate region connecting the top and bottom surfaces. In this construction, too, it is possible to fill the gap between the outer leads 33b positively and completely by the resin at the time of molding of the package body 32.

Further, it should be noted that the preferable cross section of the outer leads is by no means limited to the foregoing embodiments but any cross sectional shape having an inclined side wall may be effective for achieving a similar result.

Hereinafter, the process of fabricating the semiconductor device 31, particularly the step for molding the resin package body 32, will be described with reference to FIGS. 7A–7C.

Figure 7A:
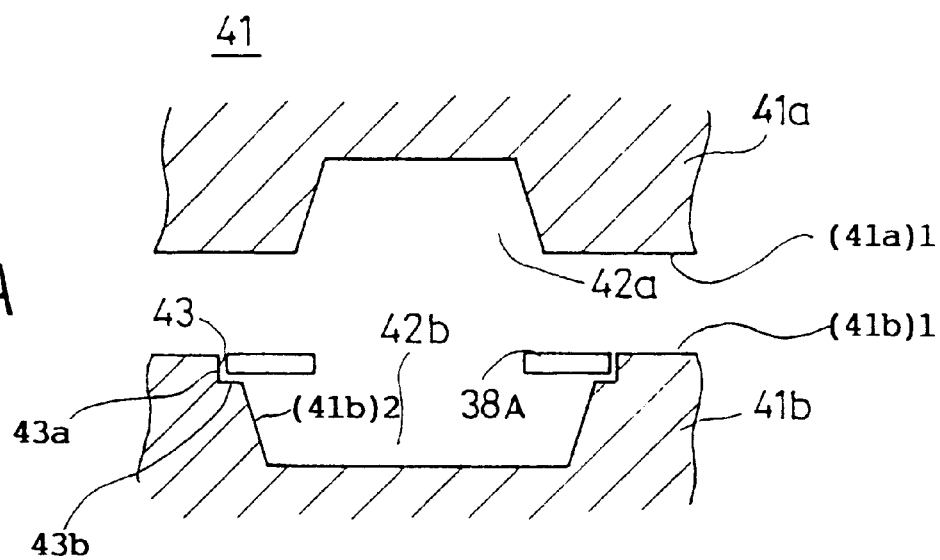
FIGS. 7A–7C are diagrams showing the process for fabricating the semiconductor device of FIGS. 3A–3C.

In the step of FIG. 7A showing a lower mold 41b and an upper mold 41a, it will be noted that the rigid member 38A is placed upon a groove 43 formed on the lower mold 41b along an inner periphery $(41b)_2$ of a rim surface $(41b)_1$ that defines a depression 42b, wherein the depression 42b has a reduced size as compared with a corresponding depression 42a that is formed on the upper mold 41a. It should be noted that the upper mold 41a has a rim surface $(41a)_1$ corresponding to the rim surface $(41b)_1$ of the lower mold 41b, wherein the rim surface $(41a)_1$ defines the depression 42a. In FIG. 7A, it should be noted the illustration of gate for injecting the resin into the mold is omitted for the sake of simplicity.

In the state of FIG. 7A, it will be noted that the groove 43 is defined by a peripheral wall 43a and a bottom surface 43b, wherein the rigid member 38A is seated upon the bottom surface 43b in engagement with the peripheral wall 43a. The groove is thereby formed with such a depth that the rigid member 38A seating upon the bottom surface 43b forms a substantially flush surface with the rim surface $(41b)_1$.

Figure 7B:
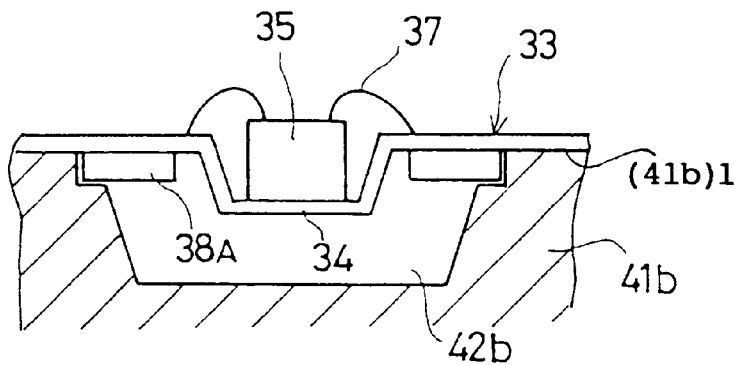

Next, in the step of FIG. 7B, the lead frame 33 carrying thereon the semiconductor chip 35 is placed upon the lower mold 41b such that the lead frame 33 is supported by the rim surface $(41b)_1$ of the mold 41b as well as by the rigid member 38A. It should be noted that the lead frame 33 carries the semiconductor chip 35 thereon in the state that the semiconductor chip 35 is wired to the part of the lead frame 33 that forms the inner leads 33a, upon completion of the device, by the bonding wires 37.

Figure 7C:
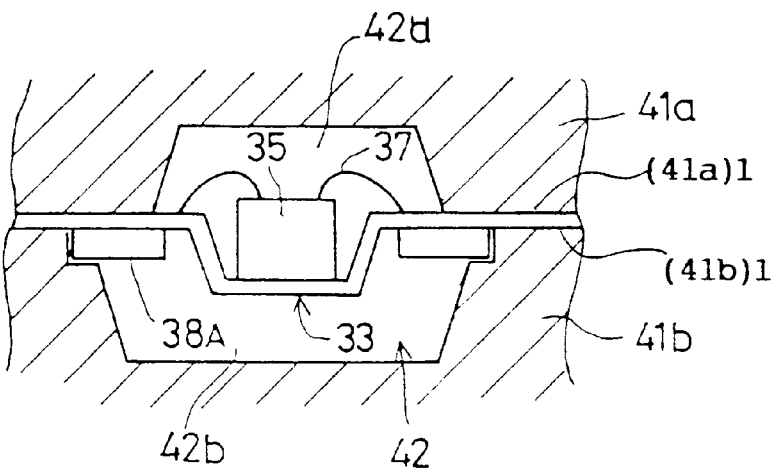

Next, in the step of FIG. 7C, the upper mold 41a is placed upon the lower mold 41b such that the rim surface $(41a)_1$ of the upper mold 41a mates with the rim surface $(41b)_1$ of the lower mold 41b, such that the lower depression 42b and the upper depression 42a form together a mold cavity 42. Thereby, the upper depression 42a forms an upper mold cavity while the lower depression 42b forms a lower mold cavity. As will be noted in FIG. 7C, the upper rim surface $(41a)_1$ has an increased area with respect to the lower rim surface $(41b)_1$.

In the state of FIG. 7C, a molten resin forming the package body 32 is poured into the mold cavity 42 from a gate not illustrated. In this molding process, it should be noted that the deformation of the lead frame in the downward direction by the pressure of the molten resin filling the smaller upper cavity part 42a preferentially, is effectively prevented or resisted by the rigid member 38A supporting the lead frame 33. Thereby, the problem of formation of the burr by the resin penetrating between the upper mold surface $(41a)_1$ and the deformed lead frame 33 is effectively eliminated.

Figure 8A:
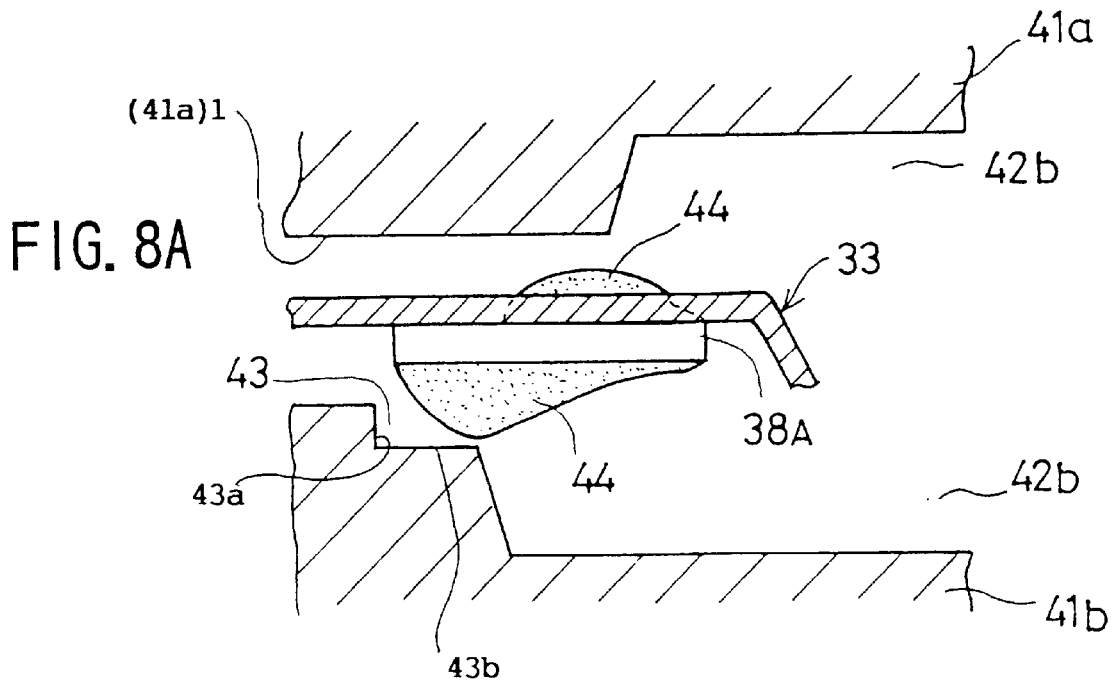
FIGS. 8A and 8B are diagrams showing the use of a soft insulating layer on the rigid member to fill a gap between the outer leads.
Figure 8B:
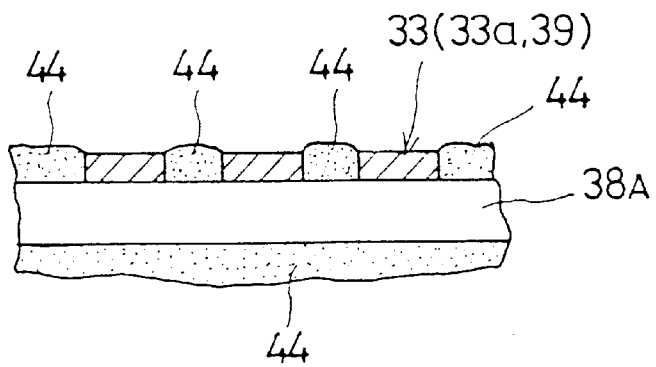

FIGS. 8A and 8B show the case of molding in which the rigid member 38A is coated by a soft insulation layer such as an adhesive.

Referring to FIG. 8A, the rigid member 38A carries, on both of a bottom surface adapted for contact with the bottom surface 43b of the groove 43 and a top surface, a layer 44 of a soft insulating material such as a solder resist or other suitable resin. Thus, when the upper mold 41a and the lower mold 41b are mated with each other as in the step of FIG.

7C, the insulating material of the layer 44 seals any gap between the rigid member 38A and the bottom surface 43b of the groove 43 as well as the gap between adjacent outer leads 33b or the test pads 39. As a result of the seal achieved by the insulating layer 41, the problem of leak of the resin forming the package body 32 at the time of molding is prevented. In the construction of FIGS. 8A and 8B, it is possible to eliminate the dam bar from the outer leads 33b, which is usually provided on an outer lead so as to prevent leak of the molten resin. As a result, there is no need to cut the dam bar after the packaging is completed, and the fabrication cost of the device is reduced.

In the event one uses a ceramic body for the rigid member 38A, it is necessary to provide a minute gap between the rigid member 38A and the upper rim surface $(41a)_1$ of the mold 41a as the time of molding, in order to avoid a damage to the ceramic rigid member 38A. Thereby, leak of the molten resin forming the package body 32 is inevitable at the time of molding, while the use of such a seal, provided by the insulating layer 41, is effective for preventing such a leak of the molten resin.

Figure 9A:
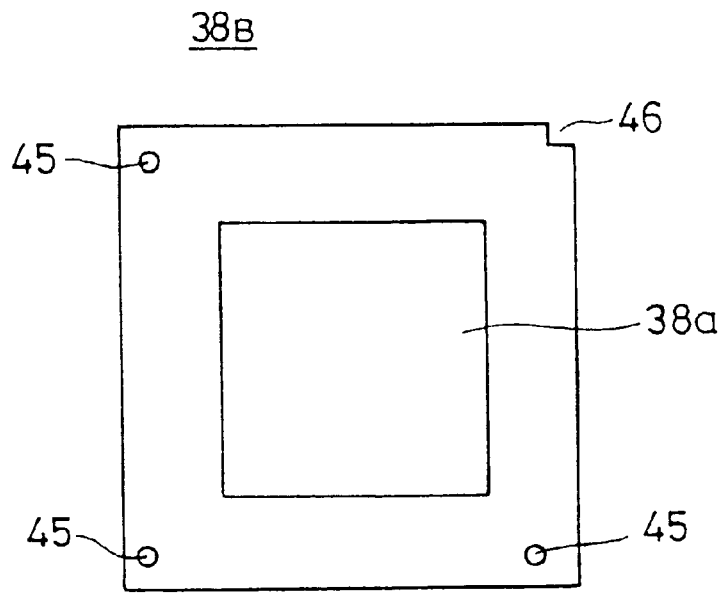
FIGS. 9A–9C are diagrams showing a rigid member having a positioning hole suitable for mounting upon a test rig and a semiconductor device that uses such a rigid member.

FIG. 9A shows a rigid member 38B that is a modification of the rigid member 38A.

Referring to FIG. 9A, the rigid member 38B is similar to the rigid member 38A except that there are formed holes 45 at three of four corners for positioning on the mold, while the remaining corner is provided with a cutout 46 for proper orientation on the test rig.

Figure 9B:
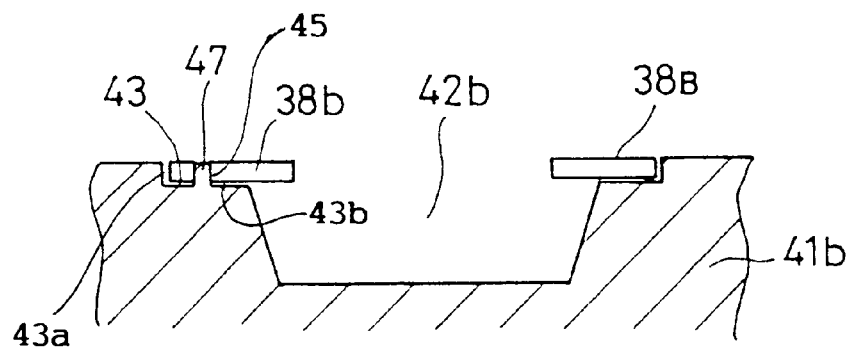

FIG. 9B shows the state in which the rigid member 38B is mounted upon the lower mold 41b. As indicated in FIG. 9B, the rigid member 38B is mounted such that positioning pins 47 provided on the bottom surface 43b of the groove 43 engage with corresponding positioning holes 45 on the rigid member 38B. By providing such positioning holes 45 on the rigid member 38B in corresponding to the positioning pins 47 on the mold 41b, the process for mounting the rigid member upon the mold is substantially facilitated.

Figure 9C:
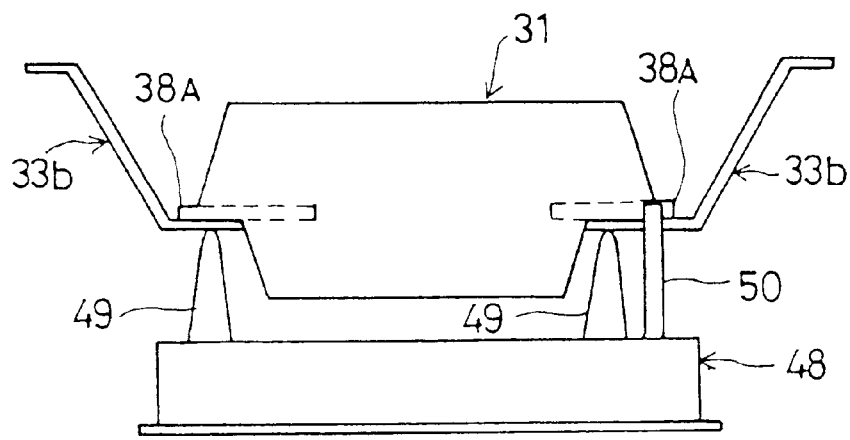

FIG. 9C shows the state in which the test of the device is conducted.

Referring to FIG. 9C, the semiconductor device 31, which carries the foregoing rigid member 38B, is mounted upon a test rig 48 that includes a number of probe electrodes 49, wherein it will be noted that the semiconductor device 31 is mounted upside down such that the test pads formed on the outer leads 33b engage with respective, corresponding probe electrodes 49. Thereby, the test rig 48 includes a positioning pin 50, and the semiconductor device 31 is mounted upon the test rig such that the positioning pin 50 engages with the positioning cutout 46 formed on the rigid member 38B. By using such a positioning cutout 46 on the rigid member 38B in combination with the positioning pin 50, a precise alignment between the probe electrodes 49 on the test rig 48 and the test pads on the outer leads 33b is guaranteed.

Figure 10A:
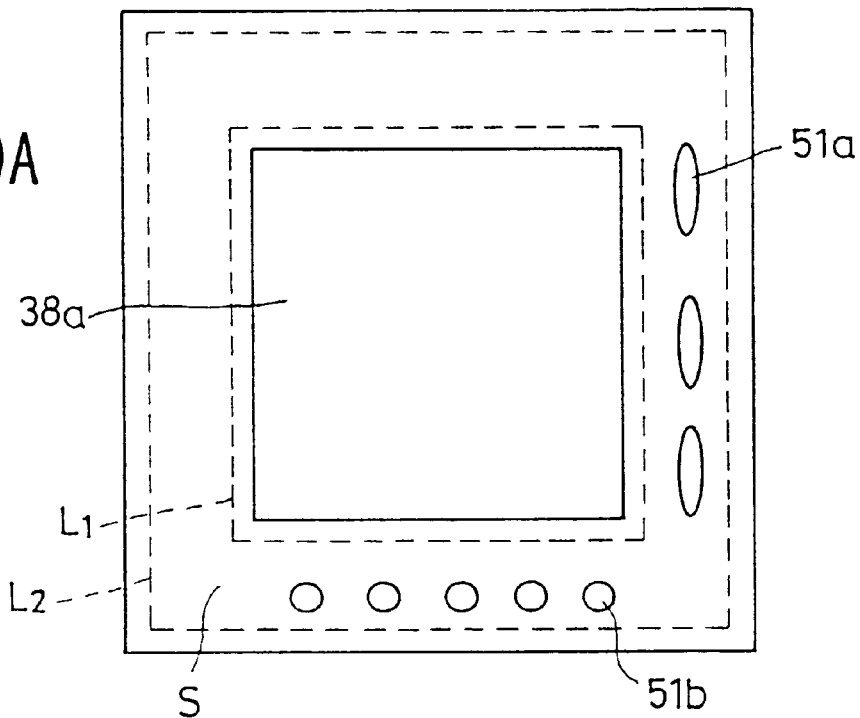
FIGS. 10A–10C are diagrams showing a rigid member having an improved adherence to the resin package body.

FIG. 10A shows a rigid member 38C that is another modification of the rigid member 38A, wherein it will be noted that the rigid member 38A is formed with a number of penetrating holes 51a and 51b in correspondence to a region S defined by a line $L_1$ corresponding to the outer periphery $(32b)_1$ of the package upper part 32b and a line $L_2$ corresponding to the outer periphery $(32a)_1$ of the package lower part 32a. In the illustrated example, the penetrating holes 51a have an elliptical form while the penetrating holes 51b have a circular form. Upon molding, the penetrating holes 51a and 51b are filled by the resin forming the package body, and the adherence of the rigid member 38C upon the resin package body 32 is substantially improved.

Figure 10B:
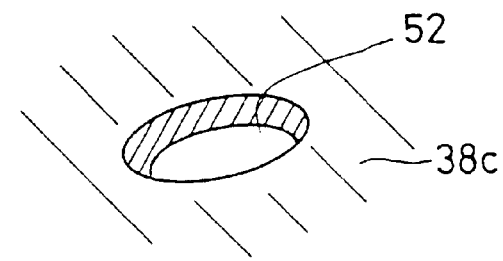
Figure 10C:
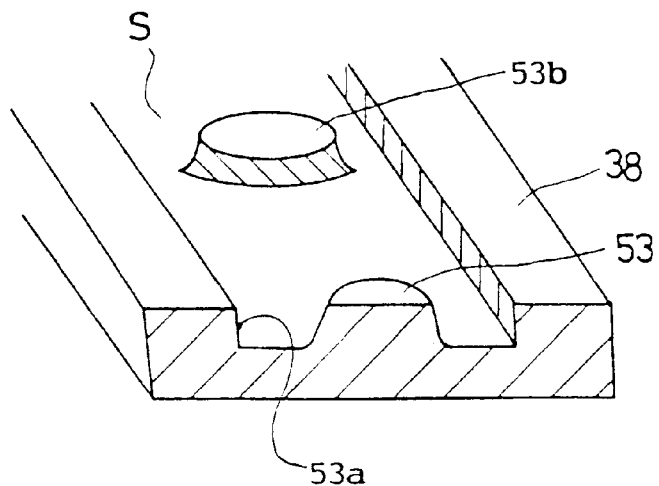

Of course, such a structure on the rigid member that improves the adherence is not limited to the penetrating holes shown in FIG. 10A, but other structures such as depressions 52 shown in FIG. 10B or a groove 53a formed with projections 53b as indicated in FIG. 10C may be employed.

Figure 11A:
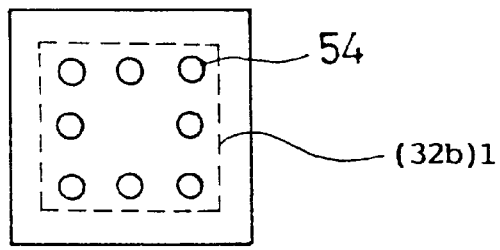
FIGS. 11A and 11B are diagrams showing a rigid member having penetrating holes for allowing molten resin to flow freely and a semiconductor device that uses such a rigid member.
Figure 11B:
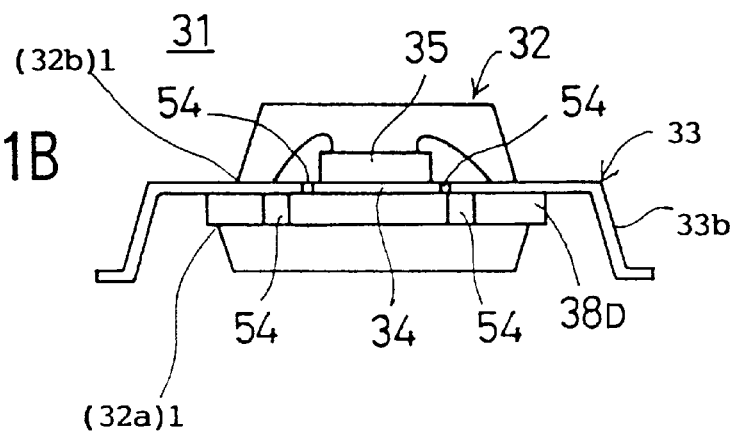

FIGS. 11A and 11B show a rigid member 38D as a further modification of the rigid member 38A, wherein the rigid member 38D is formed with penetrating holes for allowing passage of molten resin therethrough at the time of molding of the resin package body 32.

Referring to FIG. 11A, the rigid member 38D has a structure of generally rectangular or square plate, wherein the large, single opening 38a provided at the central part of the rigid member 38A, is now eliminated. Thus, the stage 34 of the lead frame 33 is directly held upon the rigid member 38D, and the lead frame 33 thereby forms a flat structure as indicated in the cross sectional view of FIG. 11B. By supporting the lead frame 33 and hence the semiconductor chip 35 directly upon the rigid member 38D, the rigid member 38D acts as an effective heat sink and the dissipation of the heat is effectively facilitated.

In order to allow the molten resin to flow freely inside the mold cavity at the time of molding the package body 32, from the upper half cavity to the lower half cavity, or vice versa, it will be noted that the rigid member 38D is formed with a number of penetrating holes in correspondence to the area located inside the outer periphery $(32b)_1$ of the upper half part 32b of the package body 32. Thereby, the upper as well as lower mold cavities are filled effectively and completely by the molten resin.

Figure 12A:
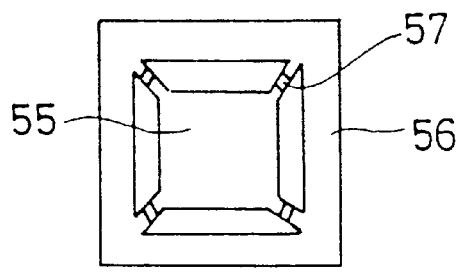
FIGS. 12A and 12B are diagrams showing a rigid member for improved heat dissipation and a semiconductor device that uses such a rigid member.
Figure 12B:
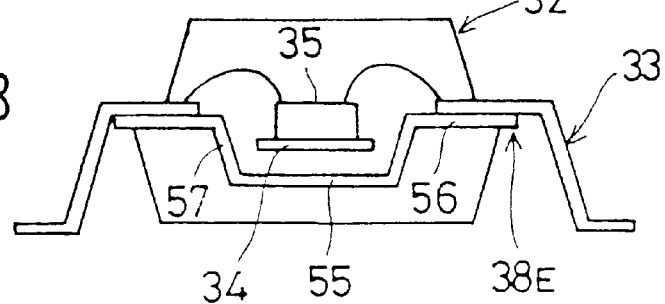

FIGS. 12A and 12B show a rigid member 38E as a still other modification of the rigid member 38A.

Referring to FIGS. 12A showing the rigid member 38E in a plan view, the rigid member 38E includes a frame part 56 that supports the outer leads 33b thereon and a recessed bottom plate 55, wherein the frame part 56 extends to surround the bottom plate 55 and is connected thereto by a bridging part 57 provided at each of the four corners of the bottom plate 55.

In the resin package body 32, the bottom plate 55 extends below the stage 34 of the lead frame 33, on which the semiconductor chip 35 is mounted, as indicated in FIG. 12B and acts as an effective heat sink. It should be noted that the bottom plate 55 is connected to the frame part 56 by the bridging part 57 and transports the heat to the exposed frame part 56 via the bridging part 57 effectively.

FIG. 13 is a further modification of the rigid member 38E, wherein it will be noted that the bottom plate 55 of the rigid member 38E is exposed at the bottom major surface of the resin package body 32. Thereby, the efficiency of heat dissipation is further improved.

It should be noted that the rigid member 38A may be supplied in the form of a feed stripe 60 indicated in FIG. 14, wherein it will be noted that the feed stripe 60 includes a stripe medium 58 that in turn includes a number of cutouts 58A formed in a row, and each of the cutouts 58A accommodates therein a rigid member 38A such that the rigid member 38A is connected to the stripe medium 58 by means of a bridging part 59 formed at the four corners of the rigid member 38A. Preferably, a groove 61 is formed at the boundary between the rigid member 38A and the bridging part 59 by means of a light etching, for facilitating disconnection of the rigid member 38A from the stripe medium 58. By using such a stripe or tape-like medium for supplying the rigid member 38A at the time of fabrication of the semiconductor device, the efficiency of production of the semiconductor device is increased substantially.

FIG. 14B shows the molding process conducted by using the rigid member 38A supplied in the form of the stripe medium 58.

Referring to FIG. 14B, it will be noted that the lower mold 41b used in the instance process does not have the groove 43 on the inner periphery of the rim surface $(41b)_1$. Thus, the stripe medium 58 is merely set upon the rim surface $(41b)_1$ of the lower mold 41b, and after setting the lead frame 33 upon the rigid member 38A still integral with the stripe medium 58, the upper mold 41a is placed upon the lower mold 41b such that the rigid member 38A and the lead frame 33 thereon are held between the rim surface $(41b)_1$ of the lower mold 41b and the rim surface $(41a)_1$ of the upper mold 41a. After molding the resin package body 32, the rigid member 38A is freed from the stripe medium 58 by cutting at the groove 61. Thereby, the semiconductor devices 31 are separated from each other.

Figure 15:
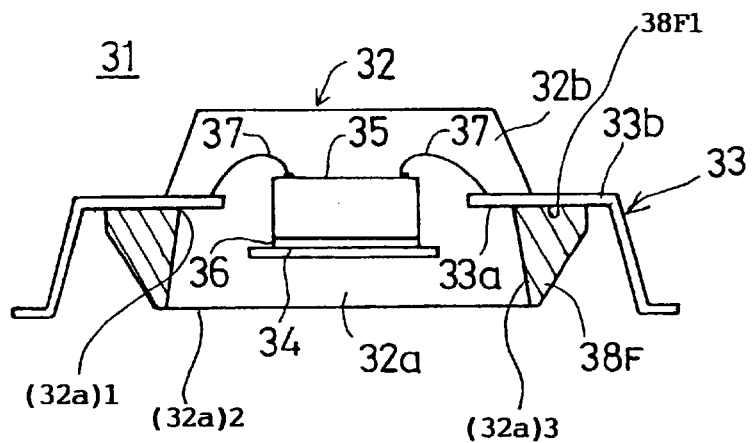
FIG. 15 is a diagram showing an embodiment of the semiconductor device of the present invention that uses another rigid member.

FIG. 15 shows the construction of the semiconductor device 31 in which a rigid member 38F is used, wherein the rigid member 38F represents a still other modification of the rigid member 38A.

Referring to FIG. 15, it will be noted that the package body 32 is formed of the lower package part 32a and the upper package part 32b similarly as before, wherein the lower package part 32b is defined by a bottom principal surface $(32a)_2$ and a circumferential side wall $(32a)_3$, and wherein the circumferential side wall $(32a)_3$ carries thereon the rigid member 38F such that the rigid member 38F makes an intimate contact with the circumferential side wall $(32a)_3$. It should be noted that the upper edge of the circumferential side wall $(32a)_3$ coincides with the outer periphery $(32a)_1$ of the lower half part 32a of the package body 32. The rigid member 38F has an upper surface $38F_1$ on which the outer leads 33b are supported. Thus, the test pads 39 are also supported on the surface $38F_1$ of the rigid member 38F.

It should be noted that the construction of FIG. 15 is also effective for dissipating heat due to the use of the rigid member 38F surrounding the package body 32 as a heat sink. As the circumferential side wall $(32a)_3$ of the resin package body 32, and hence the side wall of the rigid member 38F contacting with the foregoing circumferential side wall $(32a)_3$, are inclined toward the center of the package body 32 with respect to the bottom surface $(32a)_1$, a firm engagement is guaranteed between the lower part 32a of the package body 32 and the rigid member 32F due to the anchoring effect.

Figure 16A:
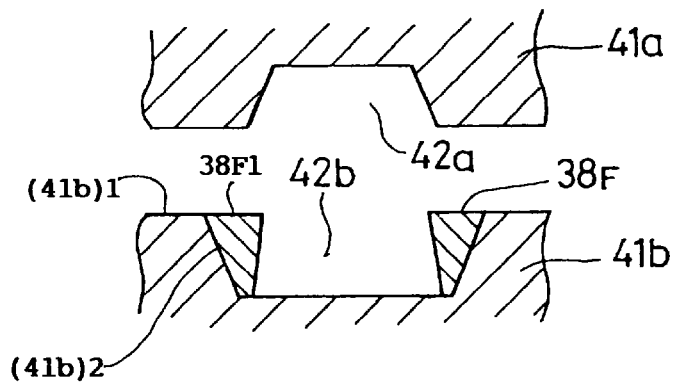
FIGS. 16A–16C are diagrams showing the process for fabricating the semiconductor device of FIG. 15.
Figure 16B:
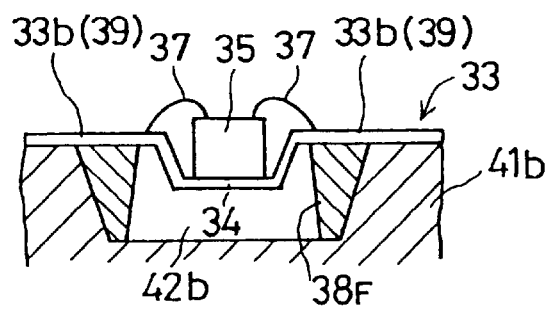
Figure 16C:
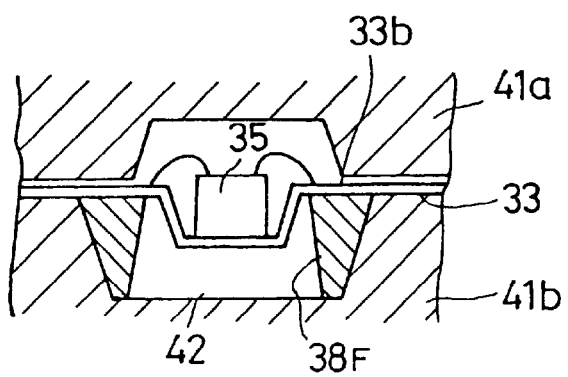

FIGS. 16A–16C show the process of fabricating the semiconductor device 31 that uses the rigid member 38F.

In the step of FIG. 16A, the rigid member 38F is mounted upon the lower mold 41b such that the rigid member 38F develops an intimate contact with the inner periphery $(41b)_2$ of the lower mold 41b defining the depression 42b and such that the upper surface $38F_1$ of the rigid member 38F forms a substantially flush surface with the rim surface $(41b)_1$ of the lower mold 41b.

Next, in the step of FIG. 16B, the lead frame 33 is set upon the lower mold 41b carrying already the rigid member 38F, wherein the lead frame 33 carries thereon the semiconductor chip 35 wired to the inner leads 33a by the bonding wires 37.

Further, in the step of FIG. 16C, the upper mold 41a is mounted upon the lower mold 41b similarly as before, and a molten resin is injected to the mold cavity 42 that is formed by the upper and lower mold depressions 42a and 42b.

Thereby, it will be noted that, while the mold depression 42a is substantially smaller than the mold depression 42b, the displacement or deformation of the lead frame 33 at the time of molding of the resin package body 33 is effectively prevented by the rigid member 38F that fills the excessive space in the lower mold cavity 42b.

Figure 17:
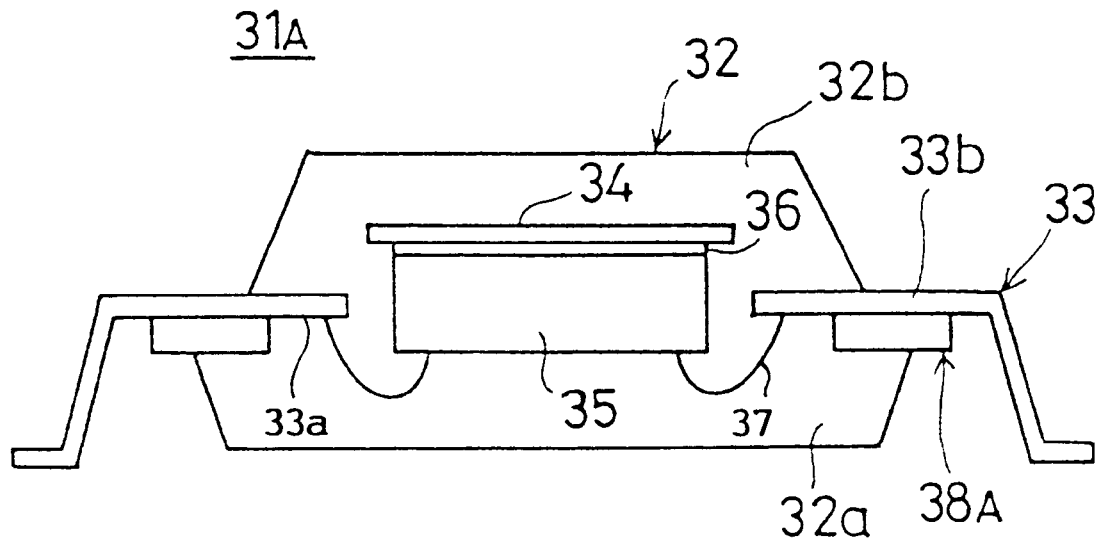
FIG. 17 is a diagram showing another embodiment of the semiconductor device of the present invention.

FIG. 17 shows a semiconductor device 31A that is a modification of the semiconductor device 31, wherein it will be noted that the semiconductor chip 35 is mounted upon the lower principal surface of the stage 34 by means of the adhesive layer 36. Thereby, the semiconductor chip 35 is wired to the inner leads 33a by the bonding wires 37 in the lower half part 32a of the resin package body 32. In such a case, too, the construction of the present invention to use the rigid member 38A for preventing the deformation of the lead frame 33 is effective.

Figure 18:
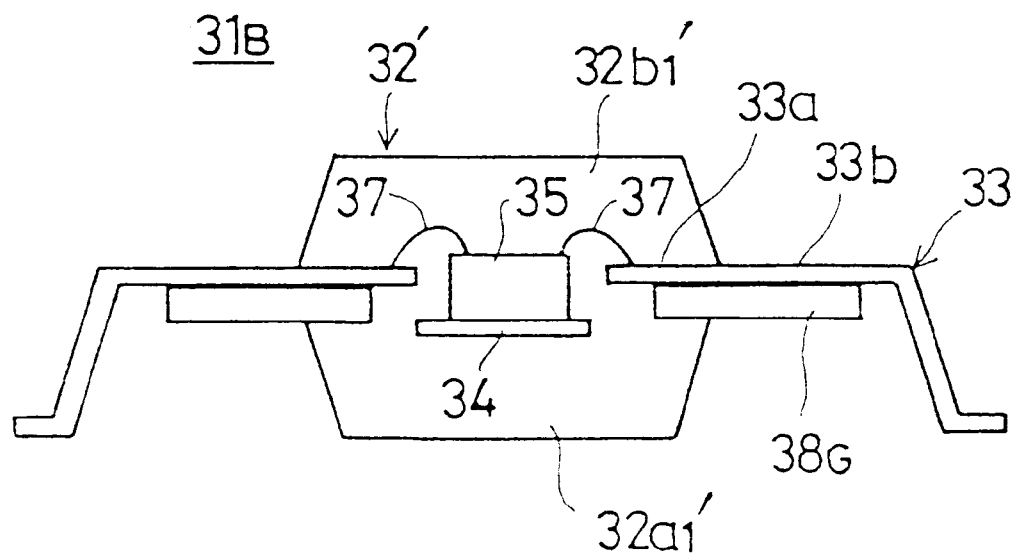
FIG. 18 is a diagram showing another embodiment of the semiconductor device of the present invention.

FIG. 18 shows a semiconductor device 31B according to another embodiment of the present invention, wherein the semiconductor device 31B has a resin package body 32' formed of a lower part $32a_1'$ and an upper part $32b_1'$ wherein the lower part $32a_1'$ and the upper part $32b_1'$ have the same size and shape. In such a case, too, it is possible to provide a rigid member 38G similar to the rigid member 38A at the boundary between the lower part $32a_1'$ and the upper part $32b_1'$, such that the rigid member 38G supports thereon the outer leads 33b and the test pads 39 not shown in FIG. 18. It should be noted that the rigid member 38G may have a insulative surface coating similarly as in the case of the rigid member 38A.

Figure 19A:
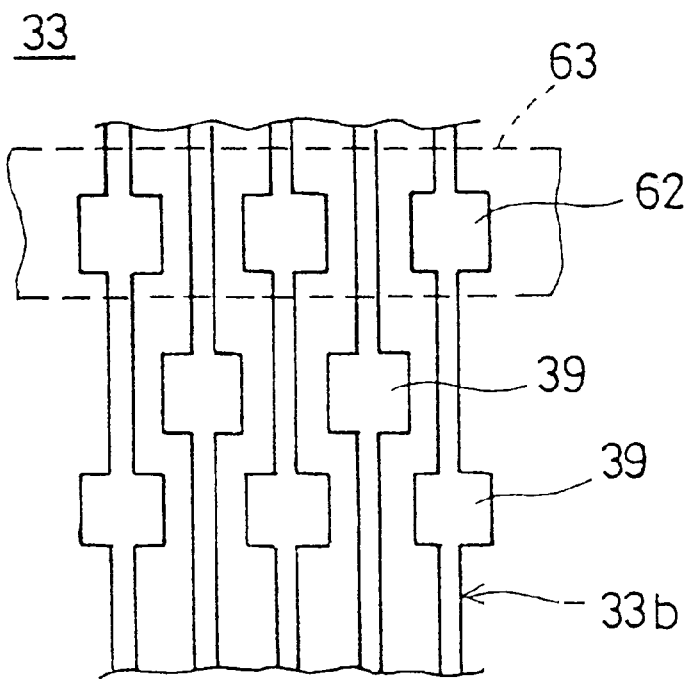
FIGS. 19A and 19B are diagrams showing the construction of the outer leads used in the present invention for preventing the leak of the molten resin at the time of molding of the resin package body.
Figure 19B:
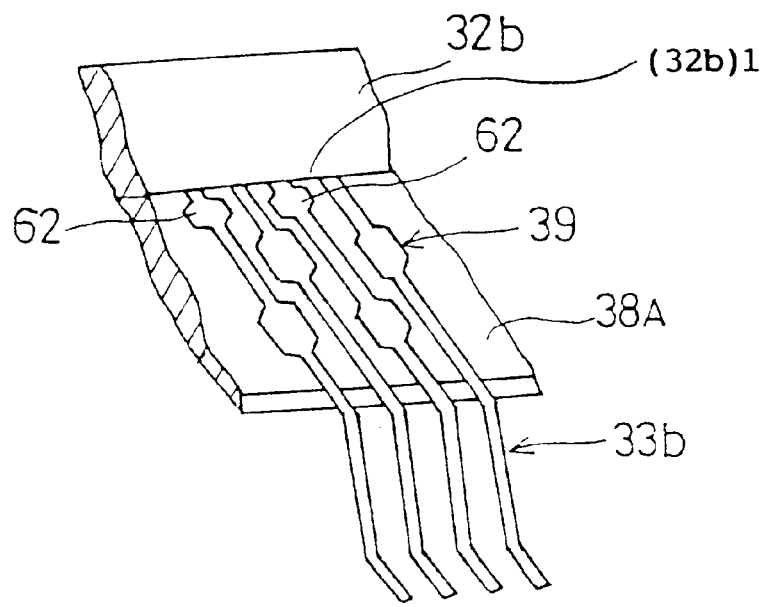

FIGS. 19A and 19B show the details of the outer leads 33b for the part supported upon the rigid member such as the member 38A, wherein FIG. 19A shows the outer leads 33b including the test pads 39 in an enlarged plan view, while FIG. 19B shows the pertinent part after the molding process of the package body 33, in a perspective view.

Figure 20:
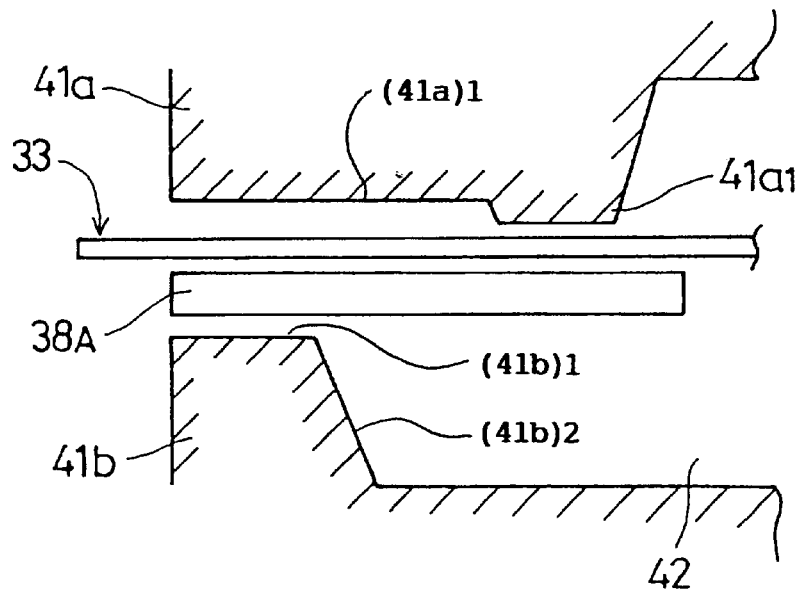
FIG. 20 is a diagram showing the details of the molding using the fixture of FIGS. 19A and 19B.

As will be noted from FIGS. 19A and 19B, each of the outer leads 33b includes a test pad 39 as a region having an increased with, such that the test pads 39 are disposed on the rigid member 38A in a staggered relationship for minimizing the mutual separation between adjacent outer leads 33b. Further, one in two of the outer leads 33b includes another pad region 62 having an increased width at a side close to the outer periphery $(32b)_1$ of the upper package part 32b, wherein such a pad region serves for a stopper for preventing the leak of the molten resin at the time of molding of the resin package body 32. It should be noted that the pad regions 62 are formed in correspondence to a region 63 that engages with a clamp area $41a_1$ that is formed on the rim surface $(41a)_1$ for contact engagement with the outer leads 33b as indicated in FIG. 20. As a result, the problem of the leaked molten resin covering the test pads 39 is effectively eliminated.

Figure 21A:
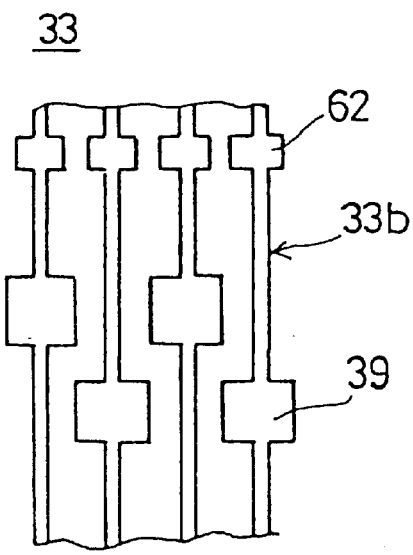
FIGS. 21A and 21B are diagrams showing other various examples of the outer leads for preventing the leak of the molten resin.
Figure 21B:
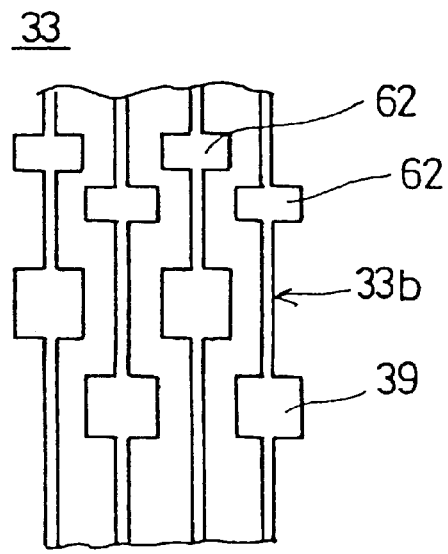

FIGS. 21A and 21B show various modifications of the pad region 62 for preventing the leak of the molten resin, wherein, in the example of FIG. 21A, the pad regions 62 are formed on each of the outer leads 33b at the same location of each outer lead 33b. Thus, the pad regions 62 are aligned in a row in the plan view of FIG. 21A. In the case of FIG. 21B, too, the pad region 62 is formed on each of the outer leads 33b, wherein the pad regions 62 are disposed on the rigid member 38A in a staggered relationship similarly to the test pads 39. In the construction of FIG. 21B, it is possible to reduce the pitch of the outer leads 33b.

Further, the present invention is not limited to the embodiments described heretofore, but various variations and modifications may be made without departing from the scope of the invention.

What is claimed is:

1. A method for fabricating a semiconductor device, comprising the steps of:

setting a rigid member upon a first mold, said first mold having a first rim surface surrounding and thereby defining a first depression;

setting a lead frame carrying thereon a semiconductor chip, such that an outer lead of said lead frame is supported upon said first rim surface and such that an inner lead of said lead frame as well as said semiconductor chip held upon a stage of said lead frame are located in said first depression, said step of setting the lead frame is conducted such that a pad region formed on said outer lead for contacting with a probe electrode is located on said rigid member;

placing a second mold having a second rim surface surrounding and thereby defining a second, smaller depression, upon said first mold, such that said second rim surface mates with said first rim surface and such that said first and second depressions form together a mold cavity in which said inner lead and said semiconductor chip are accommodated together with said stage that carries thereon said semiconductor chip; and injecting a resin into said mold cavity to mold a resin package body such that said resin package body encapsulates therein said inner lead and said semiconductor chip together with said stage.

2. A method as claimed in claim 1, wherein said first mold further includes a groove along an inner periphery of said first rim, such that said groove is defined by a peripheral wall extending along said inner periphery of said first rim and a bottom surface extending from said peripheral wall toward said first depression, and wherein said step of setting the rigid member is conducted such that said rigid member is settled in said groove.

3. A method as claimed in claim 1, wherein said step of setting said rigid member comprises a step of placing a frame member in which said rigid member is formed with a mechanical connection to said frame member by a bridging part, and wherein said method further comprises a step of removing said bridging part so as to free said rigid member from said frame member.

4. A method as claimed in claim 1, wherein said step of setting said rigid member comprises a step of placing said rigid member upon an inner circumferential wall of said first rim surface that defines said first depression such that said rigid member extends along said circumferential wall.

* * * * *